United States Patent [19]

Sasaki

[11] Patent Number: 5,241,209
[45] Date of Patent: Aug. 31, 1993

[54] SEMI-CONDUCTOR DEVICE HAVING CIRCUITS ON BOTH SIDES OF INSULATION LAYER AND ULTRASONIC SIGNAL PATH BETWEEN THE CIRCUITS

[75] Inventor: Nobuo Sasaki, Kawasaki, Japan

[73] Assignee: Fujitsu Limited, Kawasaki, Japan

[21] Appl. No.: 735,325

[22] Filed: Jul. 24, 1991

[30] Foreign Application Priority Data

Jul. 24, 1990 [JP] Japan ................................ 2-195511

[51] Int. Cl.⁵ ...................... H01L 29/84; H01L 29/96
[52] U.S. Cl. .................................. 257/416; 257/415;
  257/417; 257/508; 331/107 A; 333/154
[58] Field of Search ................ 357/26; 331/107 A;
  257/415, 416, 417, 254, 503, 506, 508, 635;
  310/336; 333/154

[56] References Cited

U.S. PATENT DOCUMENTS

| 4,160,957 | 7/1979 | Jesinger | 331/107 A |
| 4,432,007 | 2/1984 | Cady | 357/51 |
| 4,952,833 | 8/1990 | Nothnick | 370/32.1 |

FOREIGN PATENT DOCUMENTS

2376555  1/1978  France .

Primary Examiner—Sara W. Crane
Attorney, Agent, or Firm—Staas & Halsey

[57] ABSTRACT

A semiconductor device having a semiconductor substrate or an insulation layer, an integrated circuit on each of the opposite sides, or main surfaces, of the semiconductor substrate or insulation layer, and a path for an ultrasound signal interconnecting the integrated circuits. The path is afforded by an ultrasonic transducer on each of the opposite sides of the semiconductor substrate or insulation layer. A plurality of paths may be provided in the same semiconductor substrate or insulation layer without crosstalk by transmitting ultrasound signals having different frequencies through the respective paths. The paths may be one-way or two-way. The ultrasonic transducers each contain a piezoelectric material; the thickness of the piezoelectric material in the ultrasonic transducer, at least on the receiver side in each path, is such that the resonant frequency of the ultrasonic signal corresponds to the frequency of the ultrasound signal transmitted through the path. A plurality of paths through a semiconductor substrate or insulation layer for transmitting corresponding ultrasound signals of the same frequency may be provided between at least one point on one side and more than one point on the other side in a time sharing manner.

20 Claims, 7 Drawing Sheets

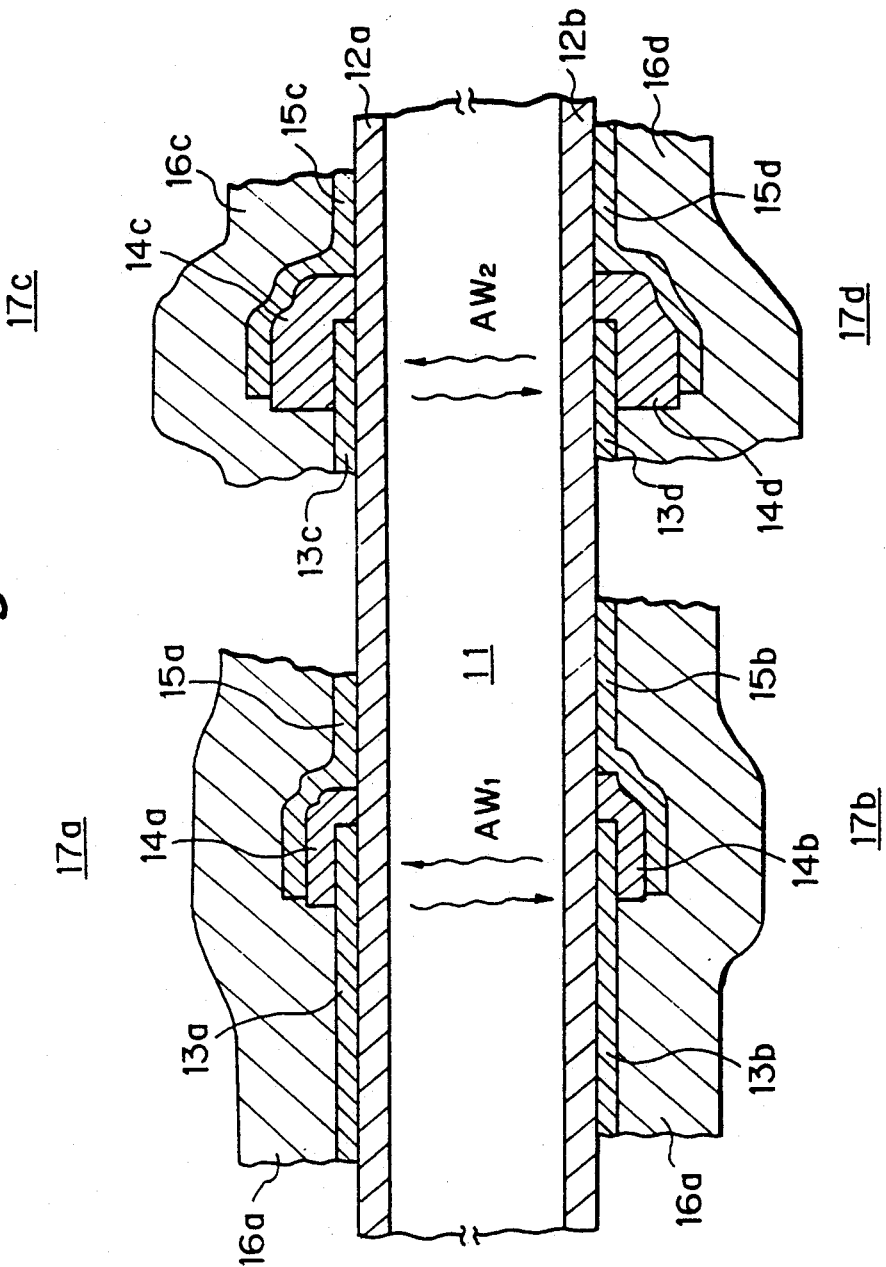

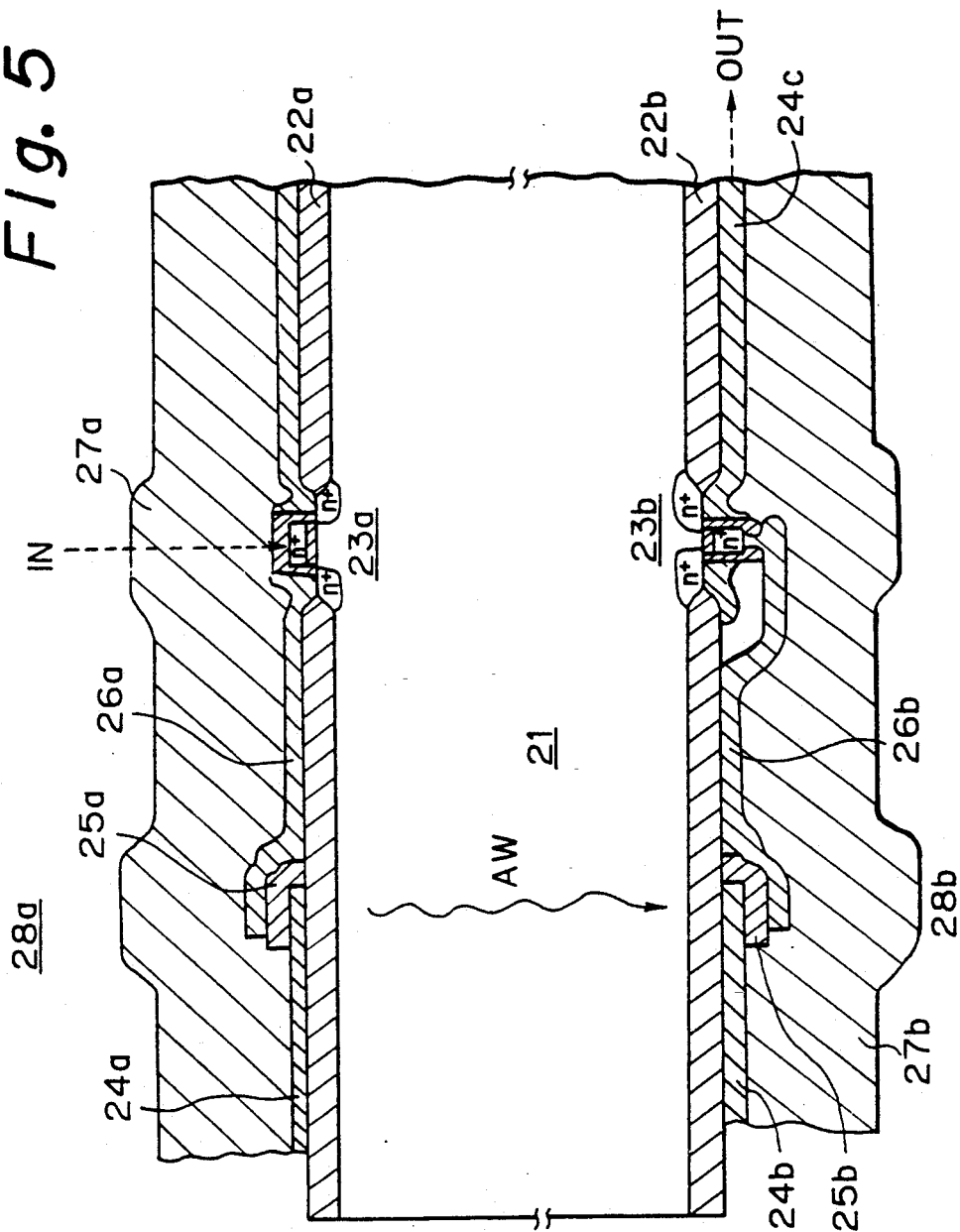

SEMI-CONDUCTOR DEVICE HAVING CIRCUITS ON BOTH SIDES OF INSULATION LAYER AND ULTRASONIC SIGNAL PATH BETWEEN THE CIRCUITS

FIELD OF THE INVENTION

The present invention relates to a semiconductor device having a plurality of layers, each containing an integrated circuit, and which layers are electrically isolated from one another, and at least one ultrasound signal path provided between to of the integrated circuits of two, respective, different layers. The layers containing the integrated circuits may be provided on one side of a semiconductor substrate, or on both opposite sides (i.e., opposite main surfaces) of the semiconductor substrate. By forming a plurality of layers each containing an integrated circuit in a semiconductor device, many circuit elements can be accommodated within the semiconductor device.

DESCRIPTION OF THE RELATED ART

Conventionally, a technique for forming integrated circuits on both of the opposite sides (i.e., opposite main surfaces) of a semiconductor substrate is known, but there is no prior art which affords a path for transmitting a signal between integrated circuits respectively on the opposite sides of the semiconductor substrate.

Japanese Unexamined Patent Publication No. 59-50583 by the present inventor discloses a technique for providing a single ultrasound signal path between two layers each containing integrated circuits, and electrically isolated from one another. FIG. 1 shows a conventional construction providing a signal path between two integrated circuits which are respectively provided on different layers formed on a (simple) main surface of a semiconductor substrate. In FIG. 1, reference numeral 41 denotes a semiconductor substrate, 42 and 48 each denote an interlayer insulation layer, 43a and 43b each denote a first wire layer, 44a and 44b each denote a layer of a piezoelectric material, 45a and 45b each denote a second insulation layer, 46a and 46b each denote a second wire layer, and 49 denotes a surface protection layer.

A first ultrasonic transducer is formed on the insulation layer 42 by the first wire layer 43a, the layer of piezoelectric material 44a, and the second wire layer 46a, and a second ultrasonic transducer is formed on the insulation layer 48 by the first wire layer 43b, the layer of piezoelectric material 44b, and the second wire layer 47b. When an ultrasound signal is generated in one ultrasonic transducer, the ultrasound signal is propagated (see oppositely directed arrows "AW") through the interlayer insulation layer 48 to the other ultrasonic transducer, and the ultrasound signal is converted to an electric signal in the ultrasonic transducer receiving the ultrasound signal. The ultrasound signal is generated in either of the ultrasonic transducers by applying a varying electric signal to the layer of piezoelectric material in the ultrasonic transducer, through the first and second wire layers 43a and 46a (or 43b and 46b).

Nevertheless, when more than one signal path becomes necessary between the different layers, which are separated by an insulation layer, crosstalk may occur between different signal paths in the insulation layer.

SUMMARY OF THE INVENTION

An object of the present invention is to provide a semiconductor device having a plurality of layers each containing an integrated circuit, which are electrically isolated from one another, and more than one signal path is provided between two of the integrated circuits to thereby prevent crosstalk between different signal paths.

According to the first aspect of the present invention, there is provided a semiconductor device comprising: first and second integrated circuits respectively provided on first and second opposite sides (i.e., opposite main surfaces) of an insulation layer, the insulation layer being provided between the first and second integrated circuits for insulating the first and second integrated circuits from one another; and a plurality of groups of ultrasonic transducers including at least one first-side ultrasonic transducer and at least one second-side ultrasonic transducer. Each first-side ultrasonic transducer in each group is provided on one of the first and second sides of the insulation layer, and connected with one of the first and second integrated circuits on the same side, for transforming an electric signal to an ultrasound signal, and outputting the ultrasound signal to the insulation layer when the electric signal is applied thereto from the integrated circuit on the same side, and each second-side ultrasonic transducer of each group is provided on the other of the first and second sides of the insulation layer, and connected with the other of the first and second integrated circuits, for transforming the ultrasound signal output to the insulation layer to an electric signal and supplying the electric signal to the integrated circuit on the same side, when an ultrasound signal is applied thereto from the first-side ultrasonic transducer in the same group through the insulation layer. The second-side ultrasonic transducers in all of the groups are each formed on the insulation layer by a piezoelectric material, the thicknesses of the piezoelectric materials of the second-side ultrasonic transducers in each group are the same, and the second-side ultrasonic transducers have a different thickness for each group, or the first and second-side ultrasonic transducers in all of the groups are each formed on the insulation layer by a piezoelectric material, the thicknesses of the piezoelectric materials of the first- and second-side ultrasonic transducers in each group are the same, and the first- and second-side ultrasonic transducers have a different thickness for each group.

In the above construction of the first aspect of the present invention, the above insulation layer may be a semiconductor substrate, and the above first and second integrated circuits may be respectively provided on first and second, opposite sides (i.e., opposite main surfaces) of the semiconductor substrate.

Further, the above first integrated circuit may comprise a high frequency modulator for each first-side ultrasonic transducer in each group for modulating an electric signal, to be supplied from the first integrated circuit to the first-side ultrasonic transducer, with a high frequency carrier wave having a frequency which corresponds to a resonant frequency of each second ultrasonic transducer in the same group, to supply the modulated signal to the first ultrasonic transducer; and the second integrated circuit may comprise a high frequency demodulator for each second-side ultrasonic transducer in each group, for receiving the electric signal generated by the transforming operation in the second-side ultrasonic transducer, and demodulating the electric signal which is modulated with the high frequency carrier wave having the frequency which corresponds to the resonant frequency of each second ultrasonic transducer in the same group.

According to the second aspect of the present invention, there is provided a semiconductor device comprising: first and second integrated circuits respectively provided on first and second, opposite sides (i.e., opposite main surfaces) of an insulation layer the insulation layer being provided between the first and second integrated circuits for insulating the first and second integrated circuits from one another; and a plurality of groups of the ultrasonic transducers including at least one first-side ultrasonic transducer and at least one second-side ultrasonic transducer. Each first-side ultrasonic transducer in each group is provided on the first side of the insulation layer and is connected with the first integrated circuit, for transforming an electric signal to an ultrasound signal and outputting the ultrasound signal to the insulation layer when the electric signal is applied thereto from the first integrated circuit, and for transforming an ultrasound signal to an electric signal and supplying the electric signal to the first integrated circuit when an ultrasound signal is applied thereto from one of the at least one second-side ultrasonic transducer in the same group through the insulation layer. Each second-side ultrasonic transducer in each group is provided on the second side of the insulation layer and is connected with the second integrated circuit, for transforming an electric signal to an ultrasound signal and outputting the ultrasound signal to the insulation layer when the electric signal is applied thereto from the second integrated circuit, and for transforming an ultrasound signal, which is transmitted thereto through the insulation layer from the first-side ultrasonic transducer in the same group, to an electric signal and supplying the electric signal to the second integrated circuit when the ultrasound signal is applied to thereto from one of the at least one first-side ultrasonic transducer in the same group, through the insulation layer. The first- and second-side ultrasonic transducers in all of the groups are each formed on the insulation layer of a piezoelectric material, the thicknesses of the piezoelectric materials of the first- and second-side ultrasonic transducers in each group are the same, and the first- and second-side ultrasonic transducers have a different thickness for each group.

In the above construction of the second aspect of the present invention, the above insulation layer may be a semiconductor substrate, and the above first and second integrated circuits may be respectively provided on first and second sides of the semiconductor substrate.

Further, the above first integrated circuit may comprise a high frequency modulator for each first-side ultrasonic transducer in each group, for modulating an electric signal to be supplied from the first integrated circuit to the first-side ultrasonic transducer with a high frequency carrier wave having a frequency which corresponds to a resonant frequency of each second ultrasonic transducer in the same group, to supply the modulated signal to the first ultrasonic transducer, and the second integrated circuit comprises a high frequency demodulator for each second-side ultrasonic transducer, for receiving the electric signal generated by the transforming operation in the second-side ultrasonic transducer, which is modulated with the high frequency carrier wave having the frequency which corresponds to the resonant frequency of each second ultrasonic transducer in the same group, and demodulating the modulated electric signal; and the second integrated circuit comprises a high frequency modulator for the second-side ultrasonic transducer in each group, for modulating an electric signal to be supplied from the second integrated circuit to the second-side ultrasonic transducer with a high frequency carrier wave having a frequency which corresponds to a resonant frequency of each second ultrasonic transducer in the same group, to supply the modulated signal to the second ultrasonic transducer, and the first integrated circuit comprises a high frequency demodulator, for each first-side ultrasonic transducer, for receiving the electric signal generated by the transforming operation in the first-side ultrasonic transducer and which is modulated with the high frequency carrier wave having the frequency which corresponds to the resonant frequency of the first ultrasonic transducer in the same group, and demodulating the electric signal.

BRIEF DESCRIPTION OF THE DRAWINGS

In the drawings:

FIG. 4 shows a construction providing a plurality of signal paths between two integrated circuits provided respectively on different layers of a semiconductor device;

FIG. 5 shows a provision of FET's in paths between ultrasonic transducers and corresponding integrated circuits.

DESCRIPTION OF THE PREFERRED EMBODIMENTS

FIG. 2

Figure 1:
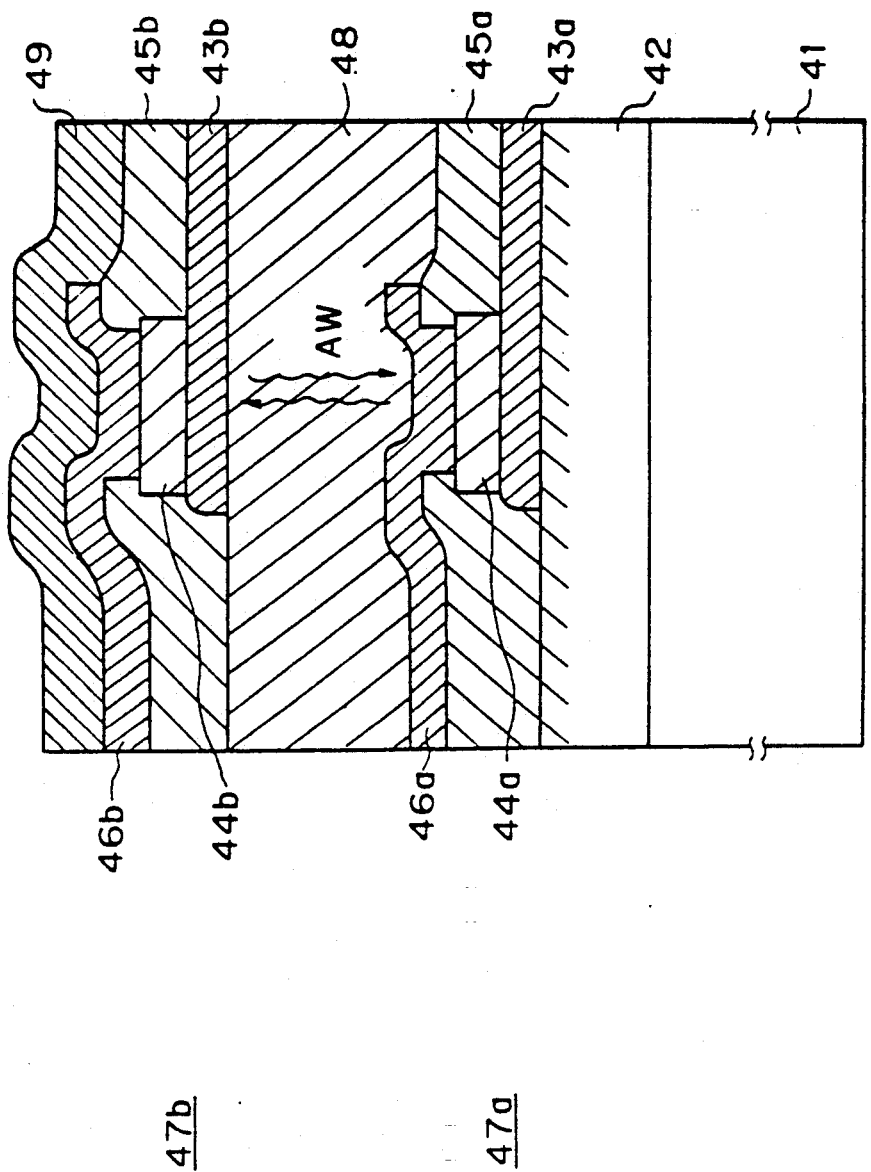
FIG. 1 shows a conventional structure providing a signal path between two integrated circuits provided respectively on different layers of a semiconductor substrate.
Figure 2:
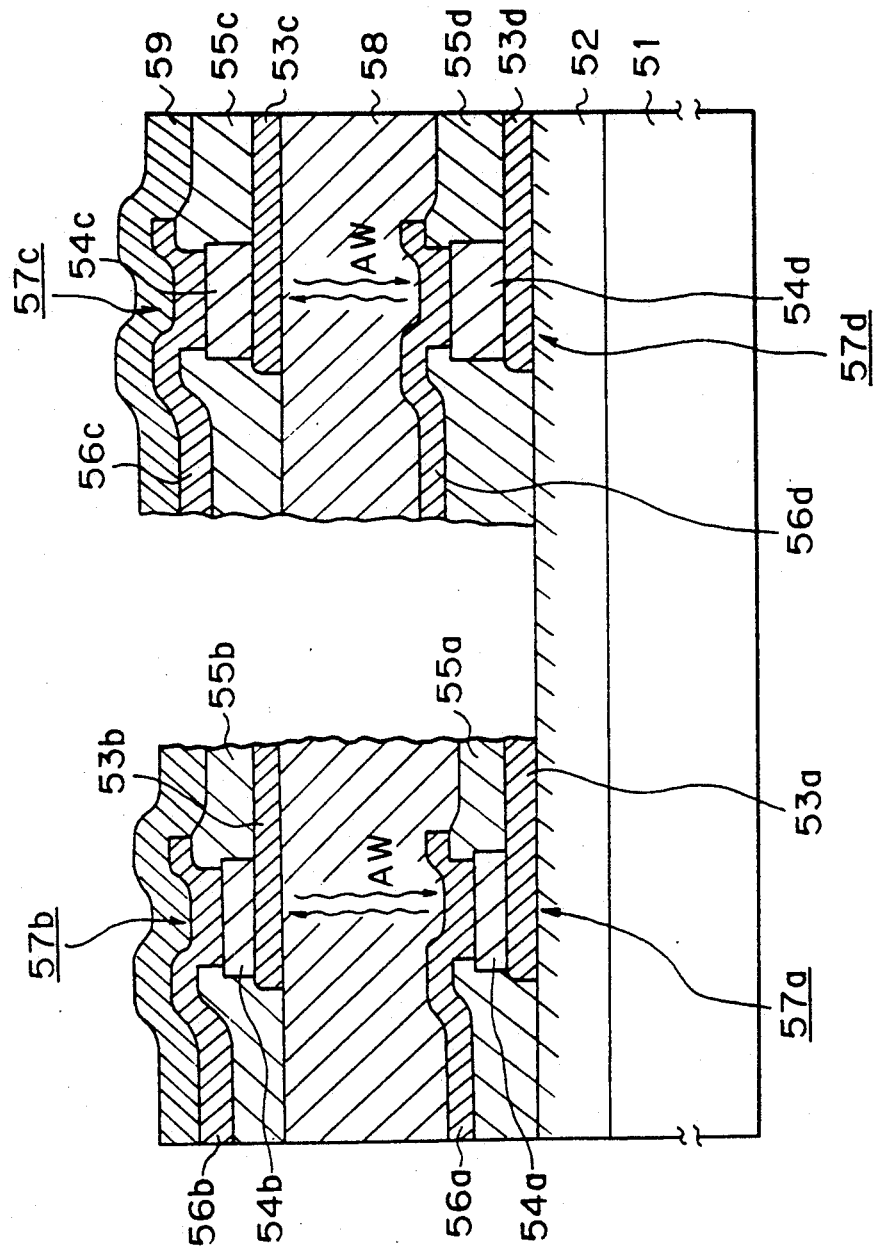
FIG. 2 shows a structure providing a plurality of signal paths between two integrated provided respectively on different layers of a semiconductor device on one side (i.e., one main surface) of a substrate.

FIG. 2 shows a construction providing a plurality of signal paths between two integrated circuits provided in different layers of a semiconductor device on one side of a semiconductor substrate. In FIG. 2, reference numeral 51 denotes a semiconductor substrate; 52 and 58 each denote an interlayer insulation layer formed of, for example, polyimide or $SiO_2$; 53a, 53b, 53c, and 53d each denote a first wire layer formed of, for example, aluminum; 54a, 54b, 54c, and 54d each denote a layer of a piezoelectric material, for example, ZnO or $LiNbO_3$; 55a, 55b, 55c, and 55d each denote a second insulation layer formed of, for example, PSG (Phospho-Silicate Glass); 56a, 56b, 56c, and 56d each denote a second wire layer formed of, for example, aluminum; and 57a, 57b, 57c, and 57d each denote an ultrasonic transducer.

The ultrasonic transducer 57a on the insulation layer 52 comprises (i.e., is constituted by) the first wire layer 53a, the layer of piezoelectric material 54a, and the second wire layer 56a; the ultrasonic transducer 57b on the insulation layer 58 comprises the first wire layer 53b, the layer of piezoelectric material 54b, and the second wire layer 56b; the ultrasonic transducer 57c on the insulation layer 52 comprises the first wire layer 53c, the layer of piezoelectric material 54c, and the second wire layer 56c; and the ultrasonic transducer 57d on the insulation layer 58 comprises the first wire layer 53d, the layer of piezoelectric material 54d, and the second wire layer 56d. The thickness of the layer of piezoelectric material 54a in the ultrasonic transducer 57a and the thickness of the layer of piezoelectric material 54b in the ultrasonic transducer 57b are the same, and the thickness of the layer of piezoelectric material 54c in the ultrasonic transducer 57c and the thickness of the layer of piezoelectric material 54d in the ultrasonic transducer 57d are the same. The common thickness of each of the layers of piezoelectric material 54a and 54b is different from the common thickness of each of layers of piezoelectric material 54c or 54d.

Each of the ultrasonic transducers 57a, 57b, 57c, and 57d generates an ultrasound signal, such that the generated ultrasound signal is propagated in the insulation layer 58, when a high frequency electric signal is applied to the transmitting, ultrasonic transducer through the associated first and second wire layers. The frequency of the generated ultrasound signal is equal to the frequency of the high frequency electric signal. When the frequency of the high frequency electric signal corresponds to a resonant frequency of one of the receiving ultrasonic transducers on the other side of the insulation layer 58, the layer of piezoelectric material in the receiving ultrasonic transducer on the other side vibrates in resonance with the ultrasound signal propagated through the insulation layer 58, and a high frequency electric signal having the above frequency is generated by the receiving resonating ultrasonic transducer which thereby outputs the high frequency electric signal through the first and second wire layers associated with the receiving ultrasonic transducer. Since the thicknesses of the layers of piezoelectric material of the ultrasonic transducers on a common side of the insulation layer 58 are different, the resonant frequencies of the ultrasonic transducers on each common side are different, and therefore, only one receiving ultrasonic transducer on the common, opposite side can be resonated with the ultrasound signal propagated from the corresponding, transmitting ultrasonic transducer on other side of the insulation layer 58.

Although not shown, the first and second wire layers associated with each ultrasonic transducer are connected with an integrated circuit formed on the same side of the semiconductor substrate 11 as the ultrasonic transducer.

When the transmission of the ultrasound signal is carried out in (i.e., directions), between the ultrasonic transducers respective formed on the opposite sides of the insulating layer and respectively containing layers of piezoelectric material having the same thickness, as shown in FIG. 2, each integrated circuit comprises a modulator and a demodulator and the above first and second wire layers respectively associated with each ultrasonic transducer are connected respectively, to an output port of the modulator and an input port of the demodulator so that an electric signal transmitted to an integrated circuit formed on the other side of the semiconductor substrate 51 is modulated with a high frequency carrier wave, and a high frequency electric signal generated in the receiving ultrasonic transducer is demodulated and the demodulated signal is supplied to another portion of the integrated circuit, where the characteristic frequencies of the modulator and the demodulator are equal to the resonant frequency of the corresponding ultrasonic transducer.

When the transmission of the ultrasound signal is carried out in only one way (i.e., direction) between the ultrasonic transducers formed on respective, different sides, a transmitting integrated circuit which generates an electric signal to be transmitted to an integrated circuit on the other, second side comprises a modulator, and a receiving integrated circuit on the other first side which is to receive an electric signal transmitted from the transmitting integrated circuit on the other second side comprises a demodulator, where the characteristic frequency of the demodulator is equal to the resonant frequency of the ultrasonic transducer to which the demodulator is connected.

FIG. 3

Figure 3:
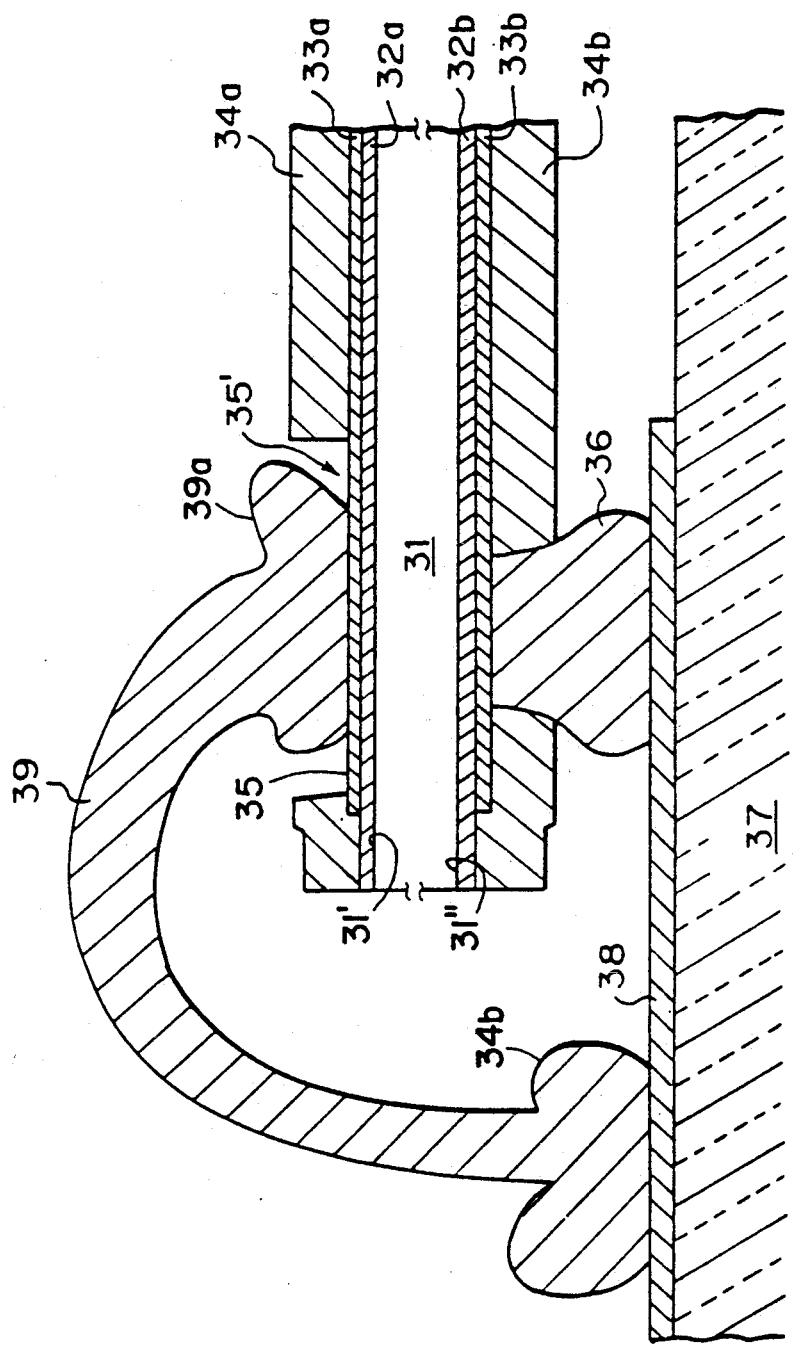
FIG. 3 shows a structure providing a signal path between two integrated circuits provided respectively opposite on two opposite sides (i.e., opposite main surfaces) of a semiconductor substrate.

FIG. 3 shows a structure providing a signal path between two integrated circuits provided respectively on two opposite sides (i.e., opposite main surfaces) of a semiconductor substrate. In FIG. 3, reference numeral 31 denotes a semiconductor substrate formed of, for example, silicon, 32a and 32b each denote a first insulation layer formed of, for example, $SiO_2$; 33a and 33b each denote a wire layer formed of, for example, aluminum; 34a and 34b each denotes a second insulation layer formed of, for example, PSG; 35 denotes a bonding pad; 36 denotes a bump formed of, for example, aluminum or gold; 37 denotes a circuit board formed of, for example, ceramics; 38 denotes a printed circuit formed of, for example, copper; and 39 denotes a bonding wire formed of, for example, aluminum.

The first insulation layers 32a and 32b are formed respectively on the opposite sides of the semiconductor substrate 31; the wire layers 33a and 33b are formed respectively on both first insulation layers 32a and 32b; and the second insulation layers 34a and 34b are formed respectively on the wire layers 33a and 33b. On the upper side of the semiconductor substrate 31, an opening 351 is provided in the second insulation layer 34a to allow a bonding pad 35 to be formed on a surface of the wire layer 33a, and one end 39a of the bonding wire 39 is bonded to the bonding pad 35. The printed circuit 38 is formed on the circuit board 37, and the other end 39b of the bonding wire 39 is bonded to a certain point on the printed circuit 38. The bump 36 is formed on the wire layer 33b to bond the wire layer 33b to a certain point (i.e., position) on the printed circuit 38 in a manner similar to a flip-chip bonding. Accordingly, when a signal path is formed between the point at which the above other end 38b of the bonding wire 39 is bonded to the printed circuit 38, and the point at which the bump 36 is bonded to the printed circuit 38, a path for transmitting a signal is formed between an integrated circuit which is formed on the upper side 31' of the semiconductor substrate 31 and an integrated circuit which is formed on the lower side 31" of the semiconductor substrate 31, through the printed circuit 38 on the circuit board 37.

To form the integrated circuits respectively on the opposite sides of the semiconductor substrate, first a wafer with a mask is provided on each side thereof is exposed in an exposing apparatus, to thus simultaneously expose both sides of the wafer. Then, the conductor layers and the insulation layers are formed, and etching is carried out by positioning the wafer upright in a semiconductor device manufacturing device such as a CVD apparatus.

In the above construction of FIG. 3, however, a bonding pad and the bump (for example 100 μm×100 μm), and therefore, the degree of accommodation in the semiconductor device is reduced because when many signal paths are provided in a semiconductor device, the areas occupied by the bonding pads and the bumps become very large compared with the areas of the integrated circuits. A technique similar to that of the above first embodiment can be applied to the semiconductor device having integrated circuits on both sides thereof, to provide more than one signal path between the integrated circuits provided on both sides, as explained below.

FIGS. 4 and 5

FIG. 4 shows a construction providing a plurality of signal paths between two integrated circuits provided respectively on two opposite sides (i.e., opposite main surfaces) of the semiconductor substrate. In FIG. 4, reference numeral 11 denotes a semiconductor substrate; 12a and 12b each denote a first insulation layer formed of, for example, $SiO_2$; 13a, 13b, 13c, and 13d each denote a first wire layer formed of, for example, aluminum; 14a, 14b, 14c, and 14d each denote a layer of a piezoelectric material, for example, ZnO; 15a, 15b, 15c, and 15d each denote a second wire layer formed of, for example, aluminum; 16a, 16b, 16c, and 16d each denote a second insulation layer formed of, for example, PSG; and 17a, 17b, 17c, and 17d each denote an ultrasonic transducer.

The ultrasonic transducer 17a is constituted on the insulation layer 12a by the first wire layer 13a, the layer of piezoelectric material 14a, and the second wire layer 15a; the ultrasonic transducer 17b is constituted on the insulation layer 12b by the first wire layer 13b, the layer of piezoelectric material 14b, and the second wire layer 15b; the ultrasonic transducer 17c is constituted on the insulation layer 12a by the first wire layer 13c, the layer of piezoelectric material 14c, and the second wire layer 15c; and the ultrasonic transducer 14d is constituted on the insulation layer 12b by the first wire layer 13d, the layer of piezoelectric material 14d, and the second wire layer 15d. The thickness of the layer of piezoelectric material 14a in the ultrasonic transducer 17a and the thickness of the layer of piezoelectric material 14b in the ultrasonic transducer 17b are the same, and the thickness of the layer of piezoelectric material 14c in the ultrasonic transducer 17c and the thickness of the layer of piezoelectric material 14d in the ultrasonic transducer 17d are the same. The thickness of each of the layers of piezoelectric material 14a or 14b is different from the thickness of each of the layers of piezoelectric material 14c or 14d.

Each of the ultrasonic transducers 17a, 17b, 17c, and 17d generates an ultrasound signal so that the generated ultrasound signal is propagated in the semiconductor substrate 11 when a high frequency electric signal is applied thereto through the first and second wire layers thereof. The frequency of the generated ultrasound signal is equal to the frequency of the high frequency electric signal. When the frequency of the high frequency electric signal corresponds to a resonant frequency of one of the ultrasonic transducers on the other side of the semiconductor substrate 11, the layer of piezoelectric material in the ultrasonic transducer on the other side vibrates in resonation with the ultrasound signal propagated through the semiconductor substrate 11, and a high frequency electric signal having the above frequency is generated in the resonating ultrasonic transducer and is output through the first and second wire layers of the ultrasonic transducer. Since the respective thicknesses of the layers of piezoelectric material in each of the ultrasonic transducers on a common side of the semiconductor substrate 11 are different, the resonant frequencies of the ultrasonic transducers on the common side are different, and therefore, only one ultrasonic transducer on one, common side can resonate with an ultrasound signal propagated from the other side of the semiconductor substrate 11.

Although not shown, the first and second wire layers associated with each ultrasonic transducer are connected with an integrated circuit formed on the same side of the semiconductor substrate 11 as the ultrasonic transducer. Before an electric signal from an integrated circuit is applied to the ultrasonic transducer, the signal may be amplified through an FET 23a formed on the same side of the semiconductor substrate as the integrated circuit and the ultrasonic transducer 28a, as shown in FIG. 5, and an high frequency electric signal generated in the ultrasonic transducer 28b may be amplified through an FET 23b formed on the same side of the semiconductor substrate as the ultrasonic transducer 28b before the signal is applied to an integrated circuit on the same side as the ultrasonic transducer 28b. Although only one FET is connected with each ultrasonic transducer in FIG. 5, two FET's may be connected to the ultrasonic transducer in parallel, one in a path leading to the ultrasonic transducer and the other in a path leading from the ultrasonic transducer, when the ultrasonic transducer is used for, selectively, both generating and transmitting an ultrasound signal, and receiving the ultrasound signal and converting the ultrasound signal to an electric signal, i.e., when the signal path between the ultrasonic transducers is two-way.

Although not shown, a modulator and/or demodulator is provided for each ultrasonic transducer in a manner similar to the construction of FIG. 2.

A layer of piezoelectric material is formed, for example, of ZnO, using the RF magnetron sputter method under the following conditions:

RF power: 150 W

Atmosphere: a mixed gas of Ar and $O_2$ where Ar:$O_2$=1:1

Pressure: 6 mTorr

Temperature of Substrate: 220° C.

The thickness of the layers of piezoelectric material 14a or 14b (FIG. 4) is, for example, 3000 Å, and the thickness of the layers of piezoelectric material 14c or 14d is, for example, 5,000 Å. The resonant frequency of the ultrasonic transducer is theoretically obtained from the thickness t of the layer of piezoelectric material and the velocity v of the longitudinal wave in the piezoelectric material, as v/2t. Since the velocity v of the longitudinal wave in ZnO is 6,200 m/sec, the resonant frequency of the ultrasonic transducer containing the layer of ZnO having the thickness of 3,000 Å is 15.5 GHz, and the resonant frequency of the ultrasonic transducer containing the layer of ZnO having the thickness of 5,000 Å is 12.4 GHz. In practice, since the layer of ZnO is sandwiched between the first and second wire layers, and is buried in the insulation layers as shown in FIG. 4, the measured values of the resonant frequencies are about 16 GHz for the thickness of 3,000 Å and about 13 GHz for the thickness of 5,000 Å, respectively.

According to the above construction of FIG. 4, crosstalk between different signal paths in the same semiconductor substrate can be prevented because ultrasound signals having different frequencies respectively are propagated through the signal paths, and the ultrasonic transducers in the receiver side do not resonate upon reception of an ultrasound signal having a frequency different from the resonant frequency of the ultrasonic transducer. Further, an area required for providing the ultrasonic transducer is reduced in the construction of FIG. 4, compared with the construction of FIG. 3, for example, to 50 $\mu m \times 50$ $\mu m$. Namely, the degree of accumulation in the semiconductor device is increased. These features are particularly advantageous when many signal paths are provided in a semiconductor device.

FIGS. 6A to 6D

FIGS. 6A to 6D are diagrams respectively showing various ways of providing signal paths between two layers, each containing an integrated circuit, and which are electrically isolated from one another. In FIGS. 6A to 6D, reference numerals 61 and 62 each denote a layer containing an integrated circuit and a plurality of ultrasonic transducers connected to the integrated circuit, and 63 denotes a layer which electrically isolates the integrated circuits from one another.

Figure 6A:
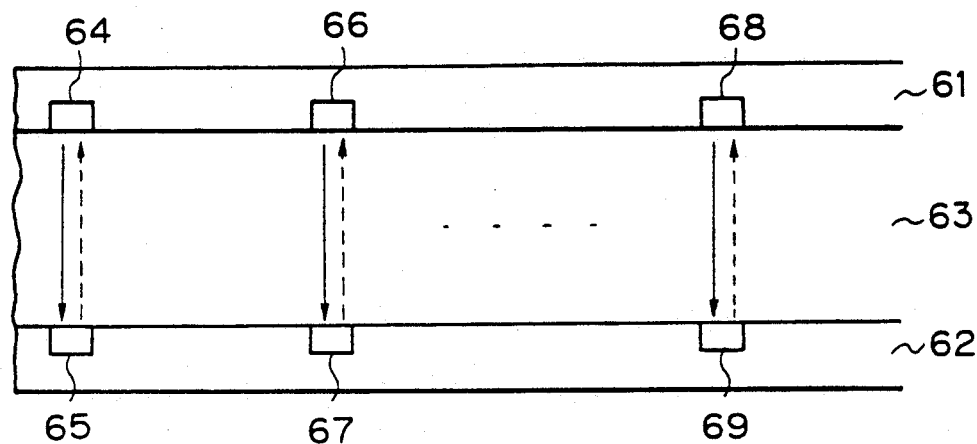
FIGS. 6A to 6D are diagrams respectively showing various ways of providing signal paths between two layers, each containing an integrated circuit, which layers are electrically isolated from one another.

In the construction of FIG. 6A, reference numerals 64 to 69 each denote an ultrasonic transducer, and a signal path is provided between a pair of ultrasonic transducers respectively located on two opposite sides of the insulation layer 63. Each signal path may be either one-way or two-way.

Figure 6B:
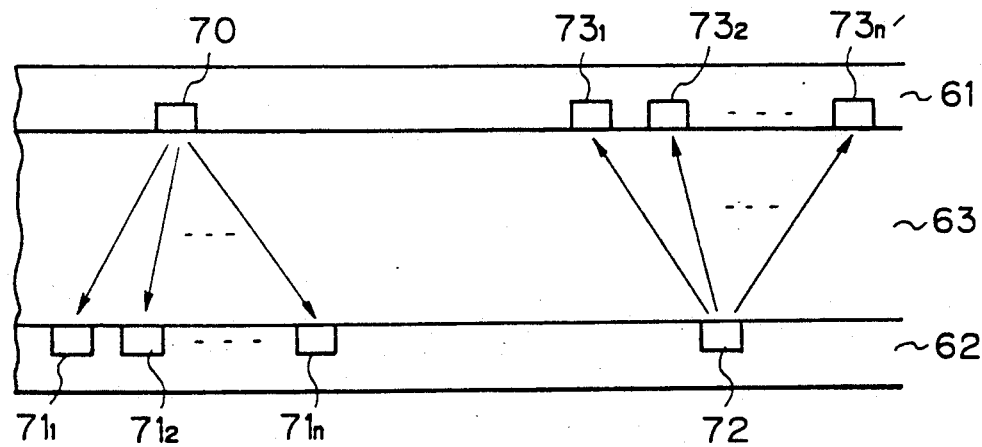

In the construction of FIG. 6B, reference numerals 70, $71_1$, $71_2$, ... $71_n$, 72, $73_1$, $73_2$, ... $73_n$ each denote an ultrasonic transducer. The ultrasonic transducers 70, $71_1$, $71_2$, ... $71_n$ belong to a (first) group, and the ultrasonic transducers 72, $73_1$, $73_2$, ... $73_n$ belong to another (second) group. The ultrasonic transducers $71_1$, $71_2$, ... $71_n$ each receive an ultrasound signal transmitted from the corresponding ultrasonic transducer 70, and the ultrasonic transducers $73_1$, $73_2$, ... $73_n$ each receive an ultrasound signal which is transmitted from the corresponding, transmitting ultrasonic transducer 72. The ultrasonic transducers $71_1$, $71_2$, $71_n$ respectively contain layers of piezoelectric material of the same thickness, and the ultrasonic transducers $73_1$, $73_2$, ... $73_n$ respectively contain layer of piezoelectric material of the same thickness. The thickness of the layer of piezoelectric material in each ultrasonic transducer $71_1$, $71_2$, ... $71_n$ and the thickness of the layer of piezoelectric material in each ultrasonic transducer $73_1$, $73_2$, ... $73_n$ are different. Namely, the frequencies of the ultrasound signals transmitted between the ultrasonic transducers in the different groups are different.

Figure 6C:
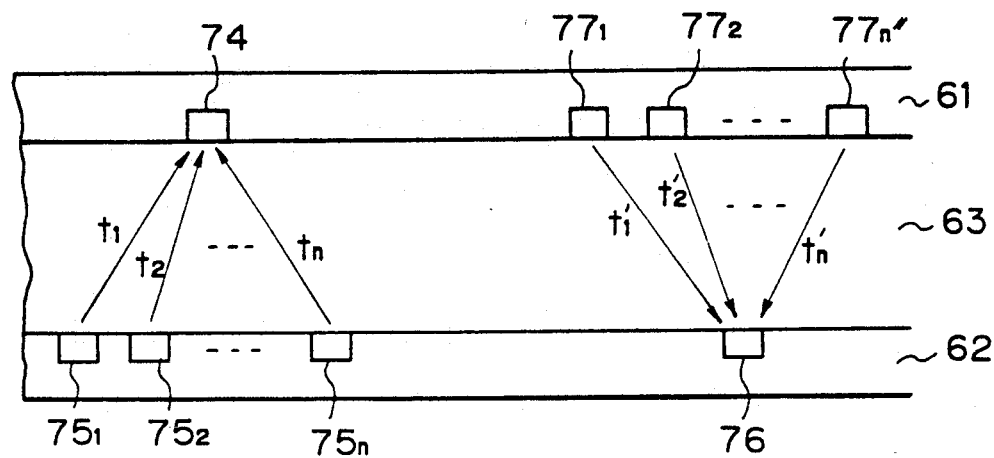

In the construction of FIG. 6C, reference numerals 74, $75_1$, $75_2$, ... $75_n$, 76, $77_1$, $77_2$, ... $77_n$ each denote an ultrasonic transducer. The ultrasonic transducers 74, $75_1$, $75_2$, ... $75_n$ belong to one (a first) group, and the ultrasonic transducers 76, $77_1$, $77_2$, ... $77_n$ belong to another group. The ultrasonic transducer 74 receives an ultrasound signal transmitted from one of the corresponding ultrasonic transducers $75_1$, $75_2$, ... $75_n$, in a time sharing manner, and the ultrasonic transducer 76 receives an ultrasound signal transmitted from one of the corresponding ultrasonic transducers $77_1$, $77_2$, ... $77_n$, in a time sharing manner. Namely, the ultrasonic transducers $75_1$, $75_2$, ... $75_n$ each output an ultrasound signal to the ultrasonic transducer 74 at a different time $t_1$, $t_2$, ... $t_n$, and the ultrasonic transducers $77_1$, $77_2$, ... $77_n$ each output an ultrasound signal to the ultrasonic transducer 76 at a different time $t_1'$, $t_2'$, ... $t_n'$. The ultrasonic transducers $75_1$, $75_2$, ... $75_n$ each output an ultrasound signal having a frequency equal to the frequency of a resonant frequency of the ultrasonic transducer 74, and the ultrasonic transducers $77_1$, $77_2$, ... $77_n$ each output an ultrasound signal having a frequency equal to the frequency of a resonant frequency of the ultrasonic transducer 76. The thickness of the layer of piezoelectric material in the ultrasonic transducer 74 and the thickness of the layer of piezoelectric material in the ultrasonic transducer 76 are different. Namely, the frequencies of the ultrasound signals which are transmitted between the ultrasonic transducers in the different groups are different.

In the constructions of FIGS. 6B and 6C, the transmission of the ultrasound signals may be carried out in two-way (i.e., in two directions) each signal path. In this case, the thickness of the layer of piezoelectric material in all the ultrasonic transducers on both sides in each group is the same.

Figure 6D:
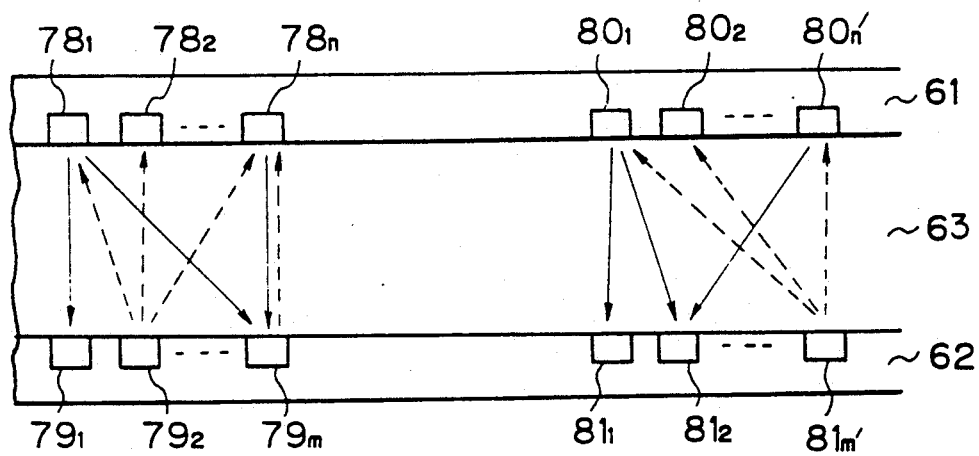

In the construction of FIG. 6D, reference numerals $78_1$, $78_2$, ... $78_n$, and $79_1$, $79_2$, ... $79_m$, $80_1$, $80_2$, ... $80_n$, and $81_1$, $81_2$, ... $81_m$ each denote an ultrasonic transducer. The ultrasonic transducers $78_1$, $78_2$, ... $78_n$, and $79_1$, $79_2$, ... $79_m$ belong to one (a first) group, and the ultrasonic transducers $80_1$, $80_2$, ... $80_n$, and $81_1$, $81_2$, ... $81_n$ belong to another (a second) group. A transmission of ultrasound signals can be carried out in the same way between the ultrasonic transducers on two sides of the insulation layer 63 in each group, as explained above with reference to FIGS. 6A to 6C. Namely, each ultrasonic transducer on one side in each group can transmit and/or receive an ultrasound signal, just as any individual one of the ultrasonic transducers in the constructions of FIGS. 6A to 6C.

I claim:

1. A semiconductor device comprising:
   an insulation layer having first and second opposite main surfaces;
   a plurality of first, and a plurality of second, ultrasonic transducers respectively formed on the first and second opposite main surfaces of the insulation layer and arranged in a plurality of groups, each group having respectively associated therewith at least one first, and at least one second, ultrasonic transducer, each ultrasonic transducer comprising a layer of piezoelectric material of a selected thickness determining the resonant frequency of the corresponding ultrasonic transducer and the respectively associated first and second ultrasonic transducers of each group having a common thickness, different from the common thickness of the first and second ultrasonic transducers of each other group of the plurality of groups thereof and correspondingly defining, for the plural groups of respectively associated first and second ultrasonic transducers, respective, plural and different operating frequencies;
   a plurality of first, and a plurality of second, integrated circuits respectively corresponding to the plurality of groups of first and second ultrasonic transducers and respectively formed on the first and second main surfaces of the insulation layer, the plurality of first integrated circuits by the insulation layer;

each first ultrasonic transducer being connected to the respective, first integrated circuit of the corresponding group and transforming an electrical signal having a frequency corresponding to the resonant frequency thereof and applied thereto by the first integrated circuit, to a corresponding ultrasound signal of the same frequency and outputting and transmitting the corresponding ultrasound signal through the insulation layer to the plurality of second ultrasonic transducers; and each second ultrasonic transducer being connected to the respective, second integrated circuit of the corresponding group and receiving each ultrasound signal transmitted through the insulation layer from a corresponding first ultrasonic transducer and transforming each received ultrasound signal having a frequency corresponding to the resonant frequency thereof to a corresponding electrical signal of the same frequency and supplying the corresponding electrical signal to the respective second integrated circuit connected thereto.

2. A semiconductor device as recited in claim 1, wherein:

each first integrated circuit comprises a high frequency modulator which receives a high frequency carrier wave having a frequency corresponding to the resonant frequency of the corresponding group and which modulates the high frequency carrier wave with the electrical signal applied thereto and supplies the modulated carrier wave signal to the respectively associated, at least one, first ultrasonic transducer; and each second integrated circuit comprises a high frequency demodulator which receives a high frequency carrier wave having a high frequency corresponding to the operating frequency of the respective group and the corresponding electrical signal, as transformed by the respective, second transducer of the corresponding group and demodulates the corresponding, received electrical signal and produces the demodulated electrical signal as an output signal of the semiconductor device.

3. A semiconductor device as recited in claim 1, wherein each of the pluralities of first and second integrated circuits has first and second terminals, and each of the pluralities of first and second ultrasonic transducers comprises:

a first conductor layer formed on the corresponding main surface of the insulation layer and connected to the first terminal of the corresponding integrated circuit of the respective group;

the layer of piezoelectric material being formed on the first conductive layer; and a second conductor layer formed on the layer of piezoelectric material and connected to the second terminal of the corresponding integrated circuit of the respective group.

4. A semiconductor device comprising:

an insulation layer having first and second opposite main surfaces;

a plurality of first, and a plurality of second, ultrasonic transducers respectively formed on the first and second opposite main surfaces of the insulation layer and arranged in a plurality of groups, each group having respectively associated therewith at least one first, and at least one second, ultrasonic transducer, each ultrasonic transducer comprising a layer of piezoelectric material of a selected thickness determining the resonant frequency of the corresponding ultrasonic transducer and the respectively associated second ultrasonic transducers of each group having a common thickness, different from the common thickness of the second ultrasonic transducers of each other group of the plurality of groups thereof and correspondingly defining, for the plural groups of respectively associated first and second ultrasonic transducers, respective, plural and different operating frequencies;

a plurality of first, and a plurality of second, integrated circuits respectively corresponding to the plurality of groups of first and second ultrasonic transducers and respectively formed on the first and second main surfaces of the insulation layer, the plurality of first integrated circuits being insulated from the plurality of second insulated circuits by the insulation layer;

each first ultrasonic transducer being connected to the respective, first integrated circuit of the corresponding group and transforming an electrical signal having a frequency corresponding to the resonant frequency thereof and applied thereto by the first integrated circuit, to a corresponding ultrasound signal of the same frequency and outputting and transmitting the corresponding ultrasound signal through the insulation layer to the plurality of second ultrasonic transducers; and each second ultrasonic transducer being connected to the respective, second integrated circuit of the corresponding group and receiving each ultrasound signal transmitted through the insulation layer from a corresponding first ultrasonic transducer and transforming each received ultrasound signal having a frequency corresponding to the resonant frequency thereof to a corresponding electrical signal of the same frequency and supplying the corresponding electrical signal to the respective second integrated circuit connected thereto.

5. A semiconductor device as recited in claim 4, wherein:

each first integrated circuit comprises a high frequency modulator which receives a high frequency carrier wave having a frequency corresponding to the resonant frequency of the corresponding group and which modulates the high frequency carrier wave with the electrical signal applied thereto and supplies the modulated carrier wave signal to the respectively associated, at least one, first ultrasonic transducer; and each second integrated circuit comprises a high frequency demodulator which receives a high frequency carrier wave having a high frequency corresponding to the operating frequency of the respective group and the corresponding electrical signal, as transformed by the respective, second transducer of the corresponding group and demodulates the corresponding, received electrical signal and produces the demodulated electrical signal as an output signal of the semiconductor device.

6. A semiconductor device as recited in claim 4, wherein each of the pluralities of first and second integrated circuits has first and second terminals, and each of the pluralities of first and second ultrasonic transducers comprises:

a first conductor layer formed on the corresponding main surface of the insulation layer and connected to the first terminal of the corresponding integrated circuit of the respective group;

the layer of piezoelectric material being formed on the first conductive layer; and a second conductor layer formed on the layer of piezoelectric material and connected to the second terminal of the corresponding integrated circuit of the respective group.

7. A semiconductor device comprising:

an insulation layer having first and second opposite main surfaces;

a plurality of first, and a plurality of second, ultrasonic transducers respectively formed on the first and second opposite main surfaces of the insulation layer and arranged in a plurality of groups, each group having respectively associated therewith at least one first, and at least one second, ultrasonic transducer, each ultrasonic transducer comprising a layer of piezoelectric material of a selected thickness determining the resonant frequency of the corresponding ultrasonic transducer and the respectively associated first and second ultrasonic transducers of each group having a common thickness, different from the common thickness of the first and second ultrasonic transducers of each other group of the plurality of groups thereof and correspondingly defining, for the plural groups of respectively associated first and second ultrasonic transducers, respective, plural and different operating frequencies;

a plurality of first, and a plurality of second, integrated circuits respectively corresponding to the plurality of groups of first and second ultrasonic transducers and respectively formed on the first and second main surfaces of the insulation layer, the plurality of first integrated circuits being insulated from the plurality of second insulated circuits by the insulation layer;

each first ultrasonic transducer being connected to the respective, first integrated circuit of the corresponding group and:

transforming an electrical signal, having a frequency corresponding to the resonant frequency thereof and applied thereto by the first integrated circuit, to a corresponding ultrasound signal of the same frequency and outputting and transmitting the corresponding ultrasound signal through the insulation layer to the plurality of second ultrasonic transducers, and receiving each ultrasonic signal transmitted through the insulation layer from a second ultrasonic transducer of the respective group and transforming each such received ultrasound signal having a frequency corresponding to the resonant frequency thereof to a corresponding electrical signal of the same frequency and supplying the corresponding electrical signal to the respective first integrated circuit connected thereto; and each second ultrasonic transducer being connected to the respective, second integrated circuit of the corresponding group and:

transforming an electrical signal, having a frequency corresponding to the resonant frequency thereof and applied thereto by the second integrated circuit, to a corresponding ultrasound signal of the same frequency and outputting and transmitting the corresponding ultrasound signal through the insulation layer to the plurality of first ultrasonic transducers, and receiving each ultrasound signal transmitted through the insulation layer from a corresponding first ultrasonic transducer and transforming each received ultrasound signal having a frequency corresponding to the resonant frequency thereof to a corresponding electrical signal of the same frequency and supplying the corresponding electrical signal to the respective second integrated circuit connected thereto.

8. A semiconductor device as recited in claim 7, wherein:

each first integrated circuit comprises:

a high frequency modulator which receives a high frequency carrier wave having a frequency corresponding to the resonant frequency of the corresponding group and which modulates the high frequency carrier wave with the electrical signal applied thereto and supplies the modulated carrier wave signal to the respectively associated, at least one, first ultrasonic transducer, and a high frequency demodulator which receives a high frequency carrier wave having a high frequency corresponding to the operating frequency of the respective group and the corresponding electrical signal, as transformed by the respective, first transducer of the corresponding group and demodulates the corresponding, received electrical signal and produces the demodulated electrical signal as an output signal of the semiconductor device; and each second integrated circuit comprises:

a high frequency modulator which receives a high frequency carrier wave having a frequency corresponding to the resonant frequency of the corresponding group and which modulates the high frequency carrier wave with the electrical signal applied thereto and supplies the modulated carrier wave signal to the respectively associated, at least one, second ultrasonic transducer, and a high frequency demodulator which receives a high frequency carrier wave having a high frequency corresponding to the operating frequency of the respective group and the corresponding electrical signal, as transformed by the respective, first transducer of the corresponding group and demodulates the corresponding, received electrical signal and produces the corresponding demodulated electrical signal.

9. A semiconductor device as recited in claim 8, wherein each of the pluralities of first and second integrated circuits has first and second terminals, and each of the pluralities of first and second ultrasonic transducers comprises:

a first conductor layer formed on the corresponding main surface of the insulation layer and connected to the first terminal of the corresponding integrated circuit of the respective group;

the layer of piezoelectric material being formed on the first conductive layer; and a second conductor layer formed on the layer of piezoelectric material and connected to the second terminal of the corresponding integrated circuit of the respective group.

10. A semiconductor device comprising:

a semiconductor substrate having first and second opposite main surfaces;

a plurality of first, and a plurality of second, ultrasonic transducers respectively formed on the first and second opposite main surfaces of the semiconductor substrate and arranged in a plurality of groups, each group having respectively associated therewith at least one first, and at least one second, ultrasonic transducer, each ultrasonic transducer comprising a layer of piezoelectric material of a selected thickness determining the resonant frequency of the corresponding ultrasonic transducer and the respectively associated first and second ultrasonic transducers of each group having a common thickness, different from the common thickness of the first and second ultrasonic transducers of each other group of the plurality of groups thereof and correspondingly defining, for the plural groups of respectively associated first and second ultrasonic transducers, respective, plural and different operating frequencies;

a plurality of first, and a plurality of second, integrated circuits respectively corresponding to the plurality of groups of first and second ultrasonic transducers and respectively formed on the first and second main surfaces of the semiconductor substrate;

each first ultrasonic transducer being connected to the respective, first integrated circuit of the corresponding group and transforming an electrical signal having a frequency corresponding to the resonant frequency thereof and applied thereto by the first integrated circuit, to a corresponding ultrasound signal of the same frequency and outputting and transmitting the corresponding ultrasound signal through the semiconductor substrate to the plurality of second ultrasonic transducers; and each second ultrasonic transducer being connected to the respective, second integrated circuit of the corresponding group and receiving each ultrasound signal transmitted through the semiconductor substrate from a corresponding first ultrasonic transducer and transforming each received ultrasound signal having a frequency corresponding to the resonant frequency thereof to a corresponding electrical signal of the same frequency and supplying the corresponding electrical signal to the respective second integrated circuit connected thereto.

11. A semiconductor device as recited in claim 10, wherein each first integrated circuit comprises a high frequency modulator which receives a high frequency carrier wave having a frequency corresponding to the resonant frequency of the corresponding group and which modulates the high frequency carrier wave with the electrical signal applied thereto and supplies the modulated carrier wave signal to the respectively associated, at least one, first ultrasonic transducer; and each second integrated circuit comprises a high frequency demodulator which receives a high frequency carrier wave having a high frequency corresponding to the operating frequency of the respective group and the corresponding electrical signal, as transformed by the respective, second transducer of the corresponding group and demodulates the corresponding, received electrical signal and produces the corresponding demodulated electrical signal.

12. A semiconductor device as recited in claim 10, wherein each of the pluralities of first and second integrated circuits has first and second terminals, first and second insulation layers are formed respectively on the first and second main surfaces of the substrate, and each of the pluralities of first and second ultrasonic transducers comprises:

a first conductor layer formed on the insulating layer on the corresponding main surface of the semiconductor substrate and connected to the first terminal of the corresponding integrated circuit of the respective group;

the layer of piezoelectric material being formed on the first conductive layer; and a second conductor layer formed on the layer of piezoelectric material and connected to the second terminal of the corresponding integrated circuit of the respective group.

13. A semiconductor device comprising:

a semiconductor substrate having first and second opposite main surfaces;

a plurality of first, and a plurality of second, ultrasonic transducers respectively formed on the first and second opposite main surfaces of the semiconductor substrate and arranged in a plurality of groups, each group having respectively associated therewith at least one first, and at least one second, ultrasonic transducers, each ultrasonic transducer comprising a layer of piezoelectric material of a selected thickness determining the resonant frequency of the corresponding ultrasonic transducer and the respectively associated second ultrasonic transducers of each group having a common thickness, different from the common thickness of the second ultrasonic transducers of each other group of the plurality of groups thereof and correspondingly defining, for the plural groups of respectively associated first and second ultrasonic transducers, respective, plural and different operating frequencies;

a plurality of first, and a plurality of second, integrated circuits respectively corresponding to the plurality of groups of first and second ultrasonic transducers and respectively formed on the first and second main surfaces of the semiconductor substrate;

each first ultrasonic transducer being connected to the respective, first integrated circuit of the corresponding group and transforming an electrical signal having a frequency corresponding to the resonant frequency thereof and applied thereto by the first integrated circuit, to a corresponding ultrasound signal of the same frequency and outputting and transmitting the corresponding ultrasound signal through the semiconductor substrate to the plurality of second ultrasonic transducers; and each second ultrasonic transducer being connected to the respective, second integrated circuit of the corresponding group and receiving each ultrasound signal transmitted through the semiconductor substrate from a corresponding first ultrasonic transducer and transforming each received ultrasound signal having a frequency corresponding to the resonant frequency thereof to a corresponding electrical signal of the same frequency and supplying the corresponding electrical signal to the respective second integrated circuit connected thereto.

14. A semiconductor device as recited in claim 13, wherein:

each first integrated circuit comprises a high frequency modulator which receives a high frequency carrier wave having a frequency corresponding to the resonant frequency of the corresponding group and which modulates the high frequency carrier wave with the electrical signal applied thereto and supplies the modulated carrier wave signal to the respectively associated, at least one, first ultrasonic transducer; and each second integrated circuit comprises a high frequency demodulator which receives a high frequency carrier wave having a high frequency corresponding to the operating frequency of the respective group and the corresponding electrical signal, as transformed by the respective, second transducer of the corresponding group and demodulates the corresponding, received electrical signal and produces the demodulated electrical signal as an output signal of the semiconductor device.

15. A semiconductor device as recited in claim 13, wherein each of the pluralities of first and second integrated circuits has fist and second terminals, first and second insulation layers are formed respectively on the first and second main surfaces of the substrate, and each of the pluralities of first and second ultrasonic transducers comprises:

a first conductor layer formed on the insulating layer on the corresponding main surface of the semiconductor substrate and connected to the first terminal of the corresponding integrated circuit of the respective group;

the layer of piezoelectric material being formed on the first conductive layer; and a second conductor layer formed on the layer of piezoelectric material and connected to the second terminal of the corresponding integrated circuit of the respective group.

16. A semiconductor device comprising:

semiconductor substrate having first and second opposite main surfaces;

a plurality of first, and a plurality of second, ultrasonic transducers respectively formed on the first and second opposite main surfaces of the semiconductor substrate and arranged in a plurality of groups, each group having respectively associated therewith at least one first, and at least one second, ultrasonic transducer, each ultrasonic transducer comprising a layer of piezoelectric material of a selected thickness determining the resonant frequency of the corresponding ultrasonic transducer and the respectively associated first and second ultrasonic transducers of each group having a common thickness, different from the common thickness of the first and second ultrasonic transducers of each other group of the plurality of groups thereof and correspondingly defining, for the plural groups of respectively associated first and second ultrasonic transducers, respective, plural and different operating frequencies;

a plurality of first, and a plurality of second, integrated circuits respectively corresponding to the plurality of groups of first and second ultrasonic transducers and respectively formed on the first and second main surfaces of the semiconductor substrate;

each first ultrasonic transducer being connected to the respective, first integrated circuit of the corresponding group and:

transforming an electrical signal, having a frequency corresponding to the resonant frequency thereof and applied thereto by the first integrated circuit, to a corresponding ultrasound signal of the same frequency and outputting and transmitting the corresponding ultrasound signal through the semiconductor substrate to the plurality of second ultrasonic transducers; and receiving each ultrasonic signal transmitted through the semiconductor substrate from a second ultrasonic transducer of the respective group and transforming each such received ultrasound signal having a frequency corresponding to the resonant frequency thereof to a corresponding electrical signal of the same frequency and supplying the corresponding electrical signal to the respective first integrated circuit connected thereto; and each second ultrasonic transducer being connected to the respective, second integrated circuit of the corresponding group and:

transforming an electrical signal, having a frequency corresponding to the resonant frequency thereof and applied thereto by the second integrated circuit, to a corresponding ultrasound signal of the same frequency and outputting and transmitting the corresponding ultrasound signal through the semiconductor substrate to the plurality of first ultrasonic transducers, and receiving each ultrasound signal transmitted through the semiconductor substrate from a corresponding first ultrasonic transducer and transforming each received ultrasound signal having a frequency corresponding to the resonant frequency thereof to a corresponding electrical signal of the same frequency and supplying the corresponding electrical signal to the respective second integrated circuit connected thereto.

17. A semiconductor device as recited in claim 16, wherein:

each first integrated circuit comprises:

a high frequency modulator which receives a high frequency carrier wave having a frequency corresponding to the resonant frequency of the corresponding group and which modulates the high frequency carrier wave with the electrical signal applied thereto and supplies the modulated carrier wave signal to the respectively associated, at least one, first ultrasonic transducer, and a high frequency demodulator which receives a high frequency carrier wave having a high frequency corresponding to the operating frequency of the respective group and the corresponding electrical signal, as transformed by the respective, first transducer of the corresponding group and demodulates the corresponding, received electrical signal and produces the demodulated electrical signal as an output signal of the semiconductor device; and each second integrated circuit comprises:

a high frequency modulator which receives a high frequency carrier wave having a frequency corresponding to the resonant frequency of the corresponding group and which modulates the high frequency carrier wave with the electrical signal applied thereto and supplies the modulated carrier wave signal to the respectively associated, at least one, second ultrasonic transducer, and a high frequency demodulator which receives a high frequency carrier wave having a high frequency corresponding to the operating frequency of the respective group and the corresponding electrical signal, as transformed by the respective, first transducer of the corresponding group and demodulates the corresponding, received electrical signal and produces the corresponding demodulated electrical signal.

18. A semiconductor device as recited in claim 16, wherein each of the pluralities of first and second integrated circuits has first and second terminals, first and second insulation layers are formed respectively on the first and second main surfaces of the substrate, and each of the pluralities of first and second ultrasonic transducers comprises:

a first conductor layer formed on the insulating layer on the corresponding main surface of the semiconductor substrate and connected to the first terminal of the corresponding integrated circuit of the respective group;

the layer of piezoelectric material being formed on the first conductive layer; and a second conductor layer formed on the layer of piezoelectric material and connected to the second terminal of the corresponding integrated circuit of the respective group.

19. A semiconductor device comprising:

a semiconductor substrate having first and second opposite main surfaces;

a plurality of first, and a plurality of second, ultrasonic transducers respectively formed on the first and second opposite main surfaces of the semiconductor substrate and arranged in a plurality of groups, each of the plural groups of respectively associated first and second ultrasonic transducers having respective plural and different operating frequencies;

a plurality of first, and a plurality of second, integrated circuits respectively corresponding to the plurality of groups of first and second ultrasonic transducers and respectively formed on the first and second main surfaces of the semiconductor substrate;

each first ultrasonic transducer being connected to the respective, first integrated circuit of the corresponding group and transforming an electrical signal having a frequency corresponding to the operating frequency of the respective group and applied thereto by the first integrated circuit, to a corresponding ultrasound signal of the same frequency and outputting and transmitting the corresponding ultrasound signal through the semiconductor substrate to the plurality of second ultrasonic transducers; and each second ultrasonic transducer being connected to the respective, second integrated circuit of the corresponding group and receiving each ultrasound signal transmitted through the semiconductor substrate from a corresponding first ultrasonic transducer and transforming each received ultrasound signal having a frequency corresponding to the operating frequency of the respective group to a corresponding electrical signal of the same frequency and supplying the corresponding electrical signal to the respective second integrated circuit connected thereto.

20. A semiconductor device comprising:

a semiconductor substrate having first and second opposite main surfaces;

a plurality of first, and a plurality of second, ultrasonic transducers respectively formed on the first and second opposite main surfaces of the semiconductor substrate and arranged in a plurality of groups, each of the plural groups of respectively associated first and second ultrasonic transducers having respective plural and different operating frequencies;

a plurality of first, and a plurality of second, integrated circuits respectively corresponding to the plurality of groups of first and second ultrasonic transducers and respectively formed on the first and second main surfaces of the semiconductor substrate;

each first ultrasonic transducer being connected to the respective, first integrated circuit of the corresponding group and:

transforming an electrical signal, having a frequency corresponding to the operating frequency of the respective group and applied thereto by the first integrated circuit, to a corresponding ultrasound signal of the same frequency and outputting and transmitting the corresponding ultrasound signal through the semiconductor substrate to the plurality of second ultrasonic transducers, and receiving each ultrasound signal transmitted through the semiconductor substrate from a corresponding second ultrasonic transducer of the respective group and transforming each such received ultrasound signal, having a frequency corresponding to the operating frequency of the respective group, to a corresponding electrical signal of the same frequency and supplying the corresponding electrical signal to the respective first integrated circuit connected thereto, and each second ultrasonic transducer being connected to the respective, second integrated circuit of the corresponding group and:

transforming an electrical signal, having a frequency corresponding to the operating frequency of the respective group and applied thereto by the first integrated circuit, to a corresponding ultrasound signal of the same frequency and outputting and transmitting the corresponding ultrasound signal through the semiconductor substrate to the plurality of first ultrasonic transducers, and each second ultrasonic transducer being connected to the respective, second integrated circuit of the corresponding group and receiving each ultrasound signal transmitted through the semiconductor substrate from a corresponding first ultrasonic transducer and transforming each received ultrasound signal having a frequency corresponding to the operating frequency of the respective group to a corresponding electrical signal of the same frequency and supplying the corresponding electrical signal to the respective second integrated circuit connected thereto.

* * * * *

UNITED STATES PATENT AND TRADEMARK OFFICE
CERTIFICATE OF CORRECTION

PATENT NO. : 5,241,209
DATED : Aug. 31, 1993
INVENTOR(S) : SASAKI

It is certified that error appears in the above-indentified patent and that said Letters Patent is hereby corrected as shown below:

Title page: [56] References Cited, please add the following:

OTHER DOCUMENTS

*PATENT ABSTRACTS OF JAPAN*, vol. 8, No. 139 (E-253) Jun. 28, 1984 & JP-A-59 050583 (FUJITSU) Mar. 23, 1984.

Col. 1, line 53, change "47*b*" to --46*b*--.

Col. 4, line 34, delete "opposite" (first occurrence).

Col. 5, line 19, before "layers" insert --the--;
line 56, after "in" insert --two ways--;
line 57, change "respective" to --respectively--;
line 63, after "connected" insert --,--.

Col. 6, line 43, change "351" to --35'--;
line 65, after "mask" delete "is".

Col. 7, line 5, before "bonding" insert --relatively large area is required for providing the--.

Col. 9, line 47, change "layer" to --layers--.

Col. 10, line 19, after "directions)" insert --on--;
line 67, after "circuits" insert --being insulated from the plurality of second insulated circuits--.

UNITED STATES PATENT AND TRADEMARK OFFICE
CERTIFICATE OF CORRECTION

PATENT NO. : 5,241,209
DATED : Aug. 31, 1993
INVENTOR(S) : SASAKI

It is certified that error appears in the above-indentified patent and that said Letters Patent is hereby corrected as shown below:

Col. 11, line 67, change "one second" to --two second--;
        line 68, change "transducer" (first occurrence) to --transducers--.

Col. 16, line 27, change "one second" to --two second--.

Col. 17, line 24, change "fist" to --first--.

Col. 19, lines 11-12, delete "corresponding";
        line 12, after "signal" insert --as an output signal--;
        lines 50-51, after "signal" insert --,--.

Signed and Sealed this

Second Day of August, 1994

Attest:

BRUCE LEHMAN

*Attesting Officer*     *Commissioner of Patents and Trademarks*